US006518721B2

(12) United States Patent
Mayama (10) Patent No.: US 6,518,721 B2
(45) Date of Patent: Feb. 11, 2003

(54) OSCILLATION ISOLATOR (75) Inventor: Takehiko Mayama, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/797,884

(22) Filed: Mar. 5, 2001

(65) Prior Publication Data

US 2001/0024403 A1 Sep. 27, 2001

(30) Foreign Application Priority Data

Mar. 24, 2000 (JP) ........................................ 2000-084188

(51) Int. Cl.$^7$ ............................................. G05D 23/275
(52) U.S. Cl. ..................... 318/632; 318/560; 318/600; 318/609; 318/611; 318/616; 318/623; 318/632; 318/686; 318/687; 318/561; 318/135; 248/550; 364/167.01
(58) Field of Search ................................ 318/561, 609, 318/611, 686, 687, 135, 560, 600, 616, 623, 632; 248/550; 364/167.01

(56) References Cited

U.S. PATENT DOCUMENTS

| 4,509,002 A | * | 4/1985 | Hollis, Jr. .................. 318/687 |
| 4,643,385 A | * | 2/1987 | Sandercock ................ 248/550 |
| 5,012,174 A | * | 4/1991 | Adkins et al. ............. 318/649 |
| RE33,937 E | * | 5/1992 | Schubert .................... 267/136 |
| 5,442,960 A | * | 8/1995 | Solberg, Jr. ................ 73/580 |
| 5,726,879 A | * | 3/1998 | Sato ........................... 364/167.01 |
| 6,021,991 A | | 2/2000 | Mayama et al. ........... 248/550 |
| 6,036,162 A | * | 3/2000 | Hayashi ..................... 248/550 |
| 6,107,770 A | * | 8/2000 | Jackson et al. ........... 318/611 |
| 6,128,552 A | | 10/2000 | Iwai et al. ................. 700/280 |
| 6,181,090 B1 | * | 1/2001 | Amaya et al. ............. 318/128 |

FOREIGN PATENT DOCUMENTS

| JP | 9-236150 | * | 2/1996 | ......... H01L/21/027 |
| JP | 9-236149 | * | 9/1997 | ......... H01L/21/027 |
| JP | 10-089403 | * | 4/1998 | ......... H01L/21/027 |
| JP | 2000-136844 | | 5/2000 | |

* cited by examiner

Primary Examiner—Robert E. Nappi
Assistant Examiner—Tyrone W Smith
(74) Attorney, Agent, or Firm—Fitzpatrick, Cella, Harper & Scinto (57) ABSTRACT An oscillation isolator for supporting an oscillation isolation platform on a pedestal includes an active oscillation isolator having a displacement generating type actuator to reduce oscillation of the platform and a displacement adjuster provided between the active oscillation isolator and the platform or the pedestal for adjusting relative displacement between the active oscillation isolator and the platform or the pedestal. The displacement adjuster has a rigidity higher than that of the active oscillation isolator and is dynamically located in series between the active oscillation isolator and the platform or the pedestal.

10 Claims, 7 Drawing Sheets

OSCILLATION ISOLATOR

FIELD OF THE INVENTION

This invention relates to a oscillation isolator for mounting a precision instrument. More particularly, the invention relates to a oscillation isolator for interrupting or inhibiting the transfer of oscillation to a oscillation isolation platform from an external element such as the pedestal on which the apparatus is installed, and for making it possible to rapidly reduce and attenuate oscillation caused by operation of the device mounted on the oscillation isolation platform and to correctly maintain the oscillation isolation platform at a prescribed position and attitude.

BACKGROUND OF THE INVENTION

An increase in the precision of precision devices such as electron microscopes and semiconductor aligners has been accompanied by a need to improve the performance of precision oscillation isolators on which such devices are mounted. In particular, in order to achieve proper and speedy exposure in a semiconductor aligner apparatus, an oscillation isolation platform is necessary to eliminate, to the greatest extent possible, oscillation from external sources starting with oscillation from the pedestal or floor on which the apparatus is placed. The reason for this is that oscillation which has an adverse effect upon exposure must be prevented from being produced in the stage used for exposure.

Further, in a semiconductor aligner, intermittent repetitive operations such as the step-and-repeat operation of the exposure XY stage and a scanning operation for scanning exposure induce oscillation of the oscillation isolation platform. The driving reaction force of the XY stage and movement of the load of the XY stage cause the oscillation isolation platform to vibrate. Accordingly, it is required that the oscillation isolator isolate the oscillation isolation platform from external oscillation starting with oscillation from the floor or pedestal on which the apparatus is installed, and there is a need to rapidly attenuate oscillation produced by operation of the equipment mounted on the oscillation isolation platform.

In particular, in order to perform exposure under conditions in which the exposure stage is being scanned in a scanning aligner, there is a need to improve the performance of oscillation reduction and suppression, making an oscillation isolator of improved capabilities essential.

In order to meet these demands, there has been developed and put into practical use an active oscillation isolator in which the oscillation of the oscillation isolation platform is sensed by a sensor, compensation is applied to the output signal of the sensor and the corrected signal is fed back to an actuator that applies a controlling force to the oscillation isolation platform, whereby oscillation of the oscillation isolation platform is controlled in active fashion. This active oscillation isolator makes it possible to realize excellent oscillation control performance that was difficult to achieve with the conventional oscillation isolator composed solely of passive spring elements and damper elements, etc.

Examples of active oscillation isolators that have been developed and put to use include an air-spring active oscillation isolator in which an air spring is used as an actuator, and an active oscillation isolator of the type in which an air-spring active oscillation isolator makes joint use of an electromagnetically driven actuator.

A next-generation oscillation isolator that has been proposed and developed controls the oscillation of the oscillation isolation platform using a displacement actuator such as a piezoelectric actuator, which is typified by a piezoelectric element, or a magnetostrictive actuator. An apparatus of this kind has been disclosed in, e.g., the specification of Japanese Patent Application No. 2000-136844 (an active oscillation isolator with a displacement-generating-type actuator).

This apparatus uses a piezeoelectric actuator, which is a displacement actuator exhibiting excellent controllability, thereby making it possible to easily provide a skyhook spring characteristic. A skyhook spring is a spring that acts upon the object whose oscillation is to be prevented from an absolutely stationary point in space, i.e., a spring element that does not produce direct interaction between the pedestal of the apparatus and the oscillation isolation platform. More specifically, an acceleration or velocity signal capable of being measured as a physical quantity with respect to an absolutely stationary point in space is compensated for suitably and rigidity with respect to the absolutely stationary point in space is adjusted using a control unit, whereby the skyhook function can be achieved.

In accordance with this apparatus, as described in detail also in the specification of Japanese Patent Application No. 2000-136844, the transmittance of oscillation of the apparatus pedestal in the low-frequency region to the oscillation isolation platform is made less than 0 dB by raising rigidity with respect to the absolutely stationary point, and amplitude of response with respect to external disturbance that acts directly upon the oscillation isolation platform can be reduced. The skyhook spring function is realized by using control means to adjust rigidity with respect to the absolutely stationary point in space. The displacement actuator, which is capable of adjusting amount of displacement directly and precisely, is suitable for implementing this.

This apparatus controls the amount of displacement of a displacement actuator based upon a signal corresponding to oscillational displacement of the apparatus pedestal such as the floor, thereby making it possible to readily absorb oscillational displacement of the apparatus pedestal and to interrupt the transfer of oscillation to a device mounted on the oscillation isolation platform.

Accordingly, it is possible to suppress an increase in amount of external oscillation of the apparatus pedestal even if the natural frequency of the support mechanism of the oscillation isolator is set high, i.e., even if the rigidity of the support mechanism that includes the displacement actuator is raised, in order to improve the ability to damp oscillation produced by operation of the device mounted on the oscillation isolation platform.

In other words, this apparatus has become the focus of attention as a next-generation oscillation isolator in order to enable implementation of a highly rigid oscillation isolator having excellent oscillation isolation performance.

With regard to use of a displacement actuator such as a piezoelectric actuator or magnetostrictive actuator, it is necessary to so arrange it that these actuators will not be subjected to force in a direction other than that in which displacement, which is the controlled variable, is produced. The reason for this is that a displacement actuator is easily damaged by force imposed from a direction other than a prescribed direction. In an oscillation isolator of this kind, therefore, an elastic member such as a rubber laminate exhibiting a high rigidity in the direction in which the displacement actuator acts and a comparatively low rigidity in a direction at right angles to this direction is used upon being arranged in series with the direction in which the displacement actuator acts.

However, the elastic member such as the rubber laminate is gradually deformed owing to the effect of the load. As a consequence, even though adjustments are made to position the oscillation isolation platform in a prescribed state when the oscillation isolator is installed, the position is shifted by deformation of the elastic member with the passage of time. Further, in a case where a movable mechanism such as an XY stage is mounted on the oscillation isolation platform and the platform is moved at high speed and acceleration, the platform is excited as by the driving reaction force, and displacement is produced.

In th field of precision equipment requiring an oscillation isolation platform, there are many instances where the positional relationship between the oscillation isolation platform and is peripheral equipment must be maintained in a predetermined state. This makes it necessary to provide means for correcting position and attitude of the oscillation isolation platform. Though the piezoelectric actuator and magnetostrictive actuator are actuators which produce displacement, the operating stroke thereof is not enough to correct for all displacements produced, and the state of the art is such that oscillation isolators which use displacement actuators do not posses functions for suitable position and attitude control. This is one factor that has impeded the more widespread use of oscillation isolators having a displacement actuator. Thus there is need for an oscillation isolator that can control displacement and attitude by means of a suitable arrangement while maintaining the merits of excellent oscillation preventing performance and high rigidity possessed by an oscillation isolator that uses a displacement actuator.

SUMMARY OF THE INVENTION

The present invention has been proposed to solve the foregoing problems of the prior art and an object thereof is to adapt an oscillation isolator having oscillation-proof support means which itself is devoid of a satisfactory position and attitude control function, such as an oscillation isolator that employs a displacement actuator, in such a manner that the position and attitude of a supported oscillation isolation platform can be maintained stably and with good reproducibility without sacrificing the merits of oscillation preventing performance, oscillation isolation capability and high rigidity possessed by such an oscillation isolator.

According to the present invention, the foregoing object is attained by providing an oscillation isolator having oscillation-proof support means for supporting an oscillation isolation platform, on which a device is mounted, on a pedestal while oscillation of the oscillation isolation platform is reduced, the oscillation isolator having displacement adjustment means provided between the oscillation-proof support means and the oscillation isolation platform or pedestal for adjusting relative displacement of between the oscillation-proof support means and the oscillation isolation platform or pedestal, wherein the displacement adjustment means having a rigidity higher than that of the oscillation-proof support means.

In a preferred embodiment of the oscillation isolator according to invention, the oscillation isolator further includes: detecting means for detecting relative displacement between the oscillation isolation platform and the pedestal; compensation means for producing an output signal upon compensating a detection signal output by the detection means; and drive control means for controlling the displacement adjustment means based upon the output signal of the compensation means; wherein position or attitude of the oscillation isolation platform is maintained in a predetermined state by control performed by the drive control means.

In a preferred embodiment of the oscillation isolator according to the invention, the oscillation-proof support means has a displacement actuator, wherein oscillation of the oscillation isolation platform is reduced actively by the actuator.

In a preferred embodiment of the oscillation isolator according to the invention, the oscillation-proof support means has a displacement actuator; an elastic member; an intermediate member for serially connecting the displacement actuator and the elastic member; a first oscillation sensor for sensing oscillation of the oscillation isolation platform; a second oscillation sensor for sensing oscillation of the intermediate member; oscillation compensation means for generating compensation information based upon output signals from the first and second oscillation sensors; and control means for driving and controlling the displacement actuator based upon the compensation information generated by the oscillation compensation means; oscillation of the oscillation isolation platform being reduced by control performed by the control means.

In a preferred embodiment of the oscillation isolator according to the invention, the oscillation isolator further includes a third oscillation sensor for sensing oscillation the pedestal, wherein the oscillation compensation means generates the compensation information based upon an output signal from the third oscillation sensor and output signals from the first and second oscillation sensors; and the control means controls the oscillation-proof support means so as to reduce transfer of oscillation from the pedestal to the oscillation isolation platform by driving the displacement actuator based upon the compensation information.

In a preferred embodiment of the oscillation isolator according to the invention, the displacement actuator is either a piezoelectric actuator, a magnetostrictive actuator or an ultramagnetostrictive actuator.

In a preferred embodiment of the oscillation isolator according to the invention, the displacement adjustment means includes: first and second wedge-shaped members supported so as to be movable in mutually different directions and contacting each other via oblique surfaces; a feed screw for advancing and retracting the first wedge-shaped member; and a motor for driving the feed screw; wherein the second wedge-shaped member is moved by the motor via the feed screw and first wedge-shaped member, whereby relative displacement between the oscillation-proof support means and the oscillation isolation platform or pedestal is adjusted.

In a preferred embodiment of the oscillation isolator according to the invention, the displacement adjustment means includes: a member supported so as to be movable in a predetermined direction; a feed screw for advancing and retracting the member; and a motor for driving the feed screw; wherein the member is moved by the motor via the feed screw, whereby relative displacement between the oscillation-proof support means and the oscillation isolation platform or pedestal is adjusted.

In a preferred embodiment of the oscillation isolator according to the invention, the oscillation isolator further includes: a force sensor for sensing a force that acts between the oscillation isolator and the oscillation isolation platform; and force compensation means for outputting compensation information obtained by compensating an output signal from the force sensor, wherein the displacement adjustment means is controlled, on the basis of the force compensation information, in such a manner that the force that acts between the oscillation isolator and the oscillation isolation platform will not depart from a predetermined range.

Thus, in the present invention, the displacement adjustment means adjusts the relative displacement between the oscillation-proof support means and the oscillation isolation platform or pedestal, thereby maintaining the position or attitude of the oscillation isolation platform in a predetermined state.

Accordingly, even if the oscillation-proof support means itself is devoid of a satisfactory position or attitude control capability, as in an oscillation isolator that employs a displacement actuator, the position or attitude of the oscillation isolation platform can be maintained stably in a prescribed state by the displacement adjustment means.

Further, the displacement adjustment mechanism has a rigidity sufficiently higher than that of the ordinary oscillation-proof mechanism such as rubber or springs, as a result of which no significant deformation is produced by an externally applied force. This means that the advantages of the oscillation-proof support means, namely its excellent oscillation isolating capability and high rigidity, are not sacrificed. Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

[First Embodiment]

Figure 1:
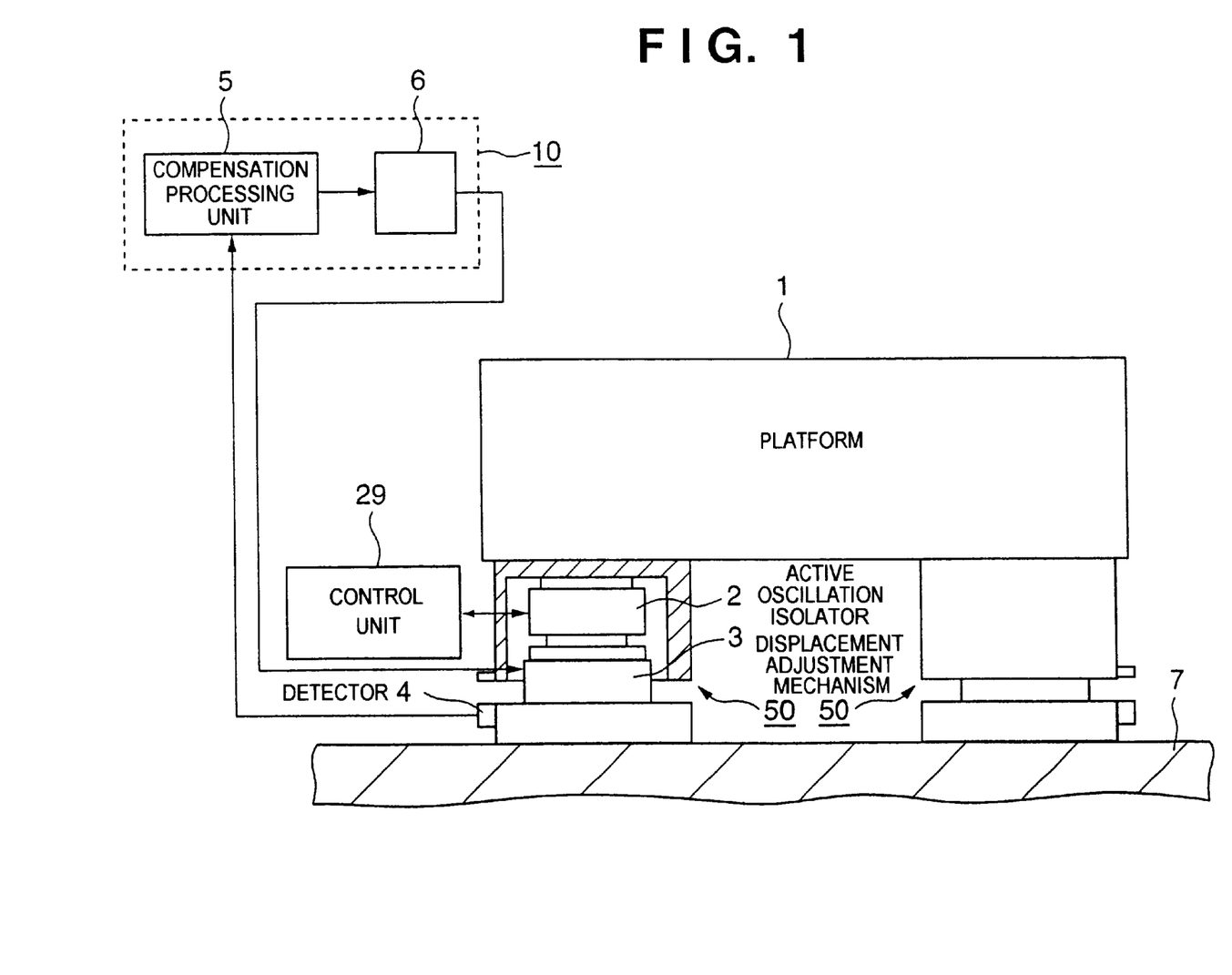
FIG. 1 is a diagram illustrating an oscillation isolator according to a first embodiment of the present invention.

FIG. 1 is a diagram showing the structure of an oscillation isolator according to a first embodiment of the present invention. The oscillation isolator, which supports a oscillation isolation platform 1, has an oscillation isolating mount 50 and control units 10, 29 for controlling the same. In this embodiment, the oscillation isolation platform 1 uses the oscillation isolating mount 50 to vertically support the oscillation isolation platform 1 against isolation, as illustrated in FIG. 1.

The oscillation isolating mount 50 includes: an active oscillation isolating means 2 for vertically supporting the oscillation isolation platform 1 against oscillation; a displacement adjustment mechanism 3, which has a rigidity sufficiently higher than that of the ordinary oscillation-proof mechanism such as rubber or springs, for adjusting vertical relative displacement between a pedestal 7 and the active oscillation isolating means 2; and a displacement detection means 4 for detecting vertical relative displacement between the oscillation isolation platform 1 and pedestal 7.

Dynamically speaking, the active oscillation isolating means 2 and displacement adjustment mechanism 3 are arranged in series. That is, the upper end of the active oscillation isolating means 2 is secured to the oscillation isolation platform 1 and its lower end is secured to the upper end of the displacement adjustment mechanism 3 so that the oscillation isolation platform 1 and displacement adjustment mechanism 3 are connected via the active oscillation isolating means 2. The lower end of the displacement adjustment mechanism 3 is secured to the pedestal 7. It should be noted that an arrangement may be adopted in which the positions of the active oscillation isolating means 2 and displacement adjustment mechanism 3 are reversed, the displacement adjustment mechanism 3 is disposed between the oscillation isolation platform 1 and the active oscillation isolating means 2 and the relative positional relationship between these is adjusted by the displacement adjustment mechanism 3.

The active oscillation isolating means 2 itself does not possess a function for controlling and maintaining the position and attitude of the oscillation isolation platform 1, as in the manner of a oscillation isolator that uses a displacement actuator. In this embodiment, a oscillation isolating device using a piezoelectric actuator is employed as the active oscillation isolating means 2.

Figure 2:
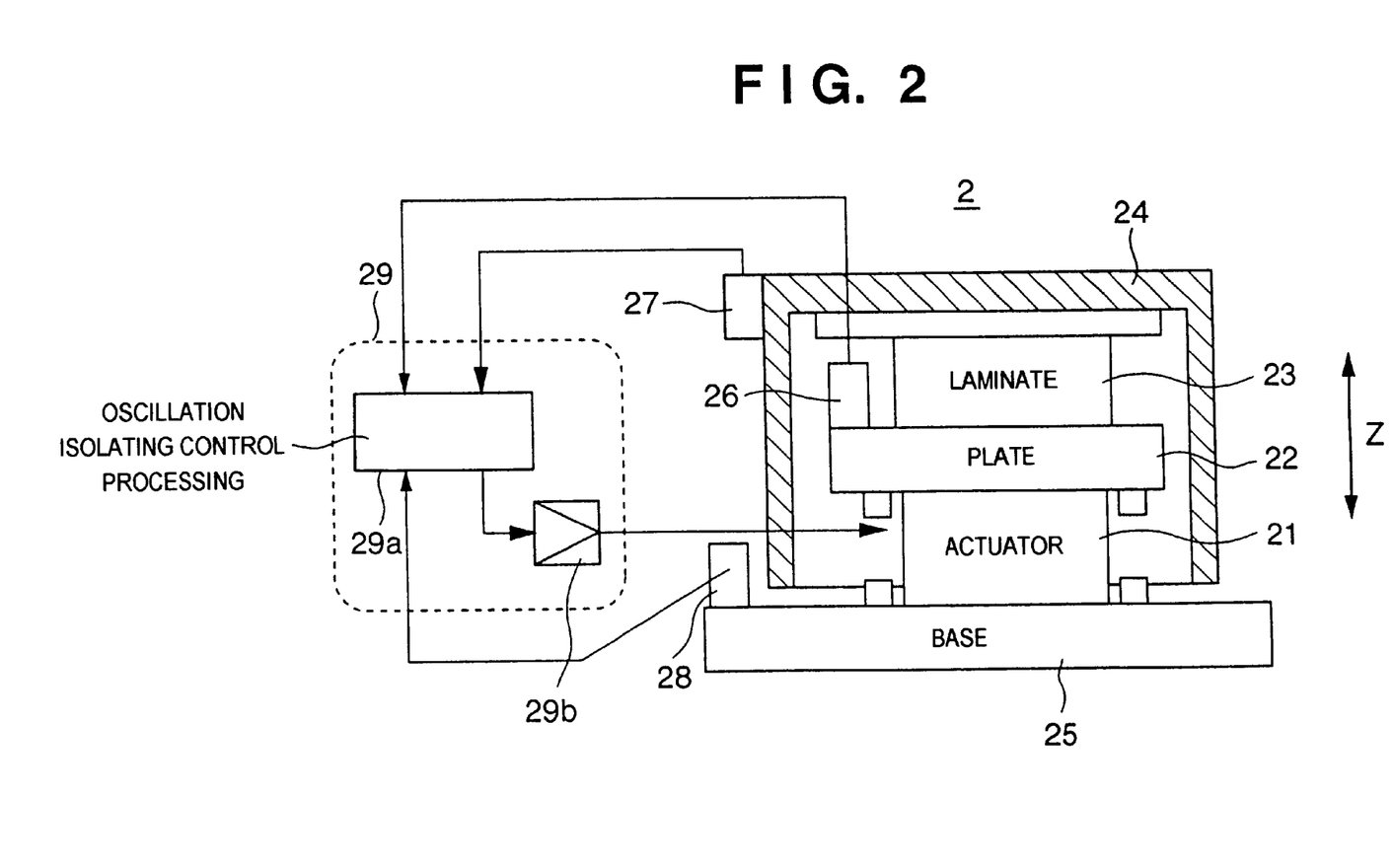
FIG. 2 is a diagram illustrating the structure of active oscillation isolating means which uses a displacement actuator provided in the apparatus of FIG. 1.

FIG. 2 illustrates the structure of the active oscillation isolating means 2. The principal elements of the active oscillation isolating means 2 are a piezoelectric actuator 21 such as a piezoelectric element for producing displacement in the Z (vertical) direction, an intermediate plate 22, and a rubber laminate 23 serving as a elastic member having a high rigidity in the Z direction and a low rigidity in the at right angles to the Z direction. These elements are disposed between a oscillation isolating structure 24 and a base structure 25.

More specifically, the oscillation isolating structure 24 is connected to the intermediate plate 22 via the rubber laminate 23 and to the base structure 25 via the piezoelectric actuator 21. The oscillation isolating structure 24 is rigidly connected to the oscillation isolation platform 1 and the base structure 25 is secured rigidly on the displacement adjustment mechanism 3.

The active oscillation isolating means 2 has oscillation sensors 26 and 27 for sensing the oscillation of the intermediate plate 22 and oscillation isolating structure 24, respectively. A velocity sensor or geophone sensor for sensing the velocity of these parts and an acceleration sensor for sensing their acceleration can be used as the oscillation sensors 26 and 27. Furthermore, it is preferred that the active oscillation isolating means 2 have a base oscillation sensor 28 for sensing the oscillation of the base structure 25. A velocity sensor, geophone sensor or acceleration sensor can be used as the base oscillation sensor 28.

The active oscillation isolating means 2 has its operation controlled by a oscillation controller 29 for driving and controlling the piezoelectric actuator 21 based upon output signals from the oscillation sensors 26, 27 and base oscillation sensor 28. The oscillation controller 29 has a oscillation isolating control processor 29a for applying control processing to output signals from the oscillation sensors 26, 27 and base oscillation sensor 28, and a piezoelectric driving circuit 29b for driving the piezoelectric actuator 21 based upon a control signal obtained by the oscillation isolating control processor 29a. In order to implement above descried skyhook spring function and a oscillation reducing effect such as the absorption or cancellation of oscillation of the pedestal 7 caused by the piezoelectric actuator 21, the oscillation isolating control processor 29a subjects the oscillation sensors 26 and 27 to a compensation operation beginning with PID compensation or compensation obtained by serially connecting PID compensation and integrating compensation, and subjects the base oscillation sensor 28 to a compensation operation beginning with integrating compensation or double integrating compensation. The piezoelectric driving circuit 29b drives the piezoelectric actuator 21 based upon a compensation signal obtained as a result of the compensation operation performed by the oscillation isolating control processor 29a.

Figure 3:
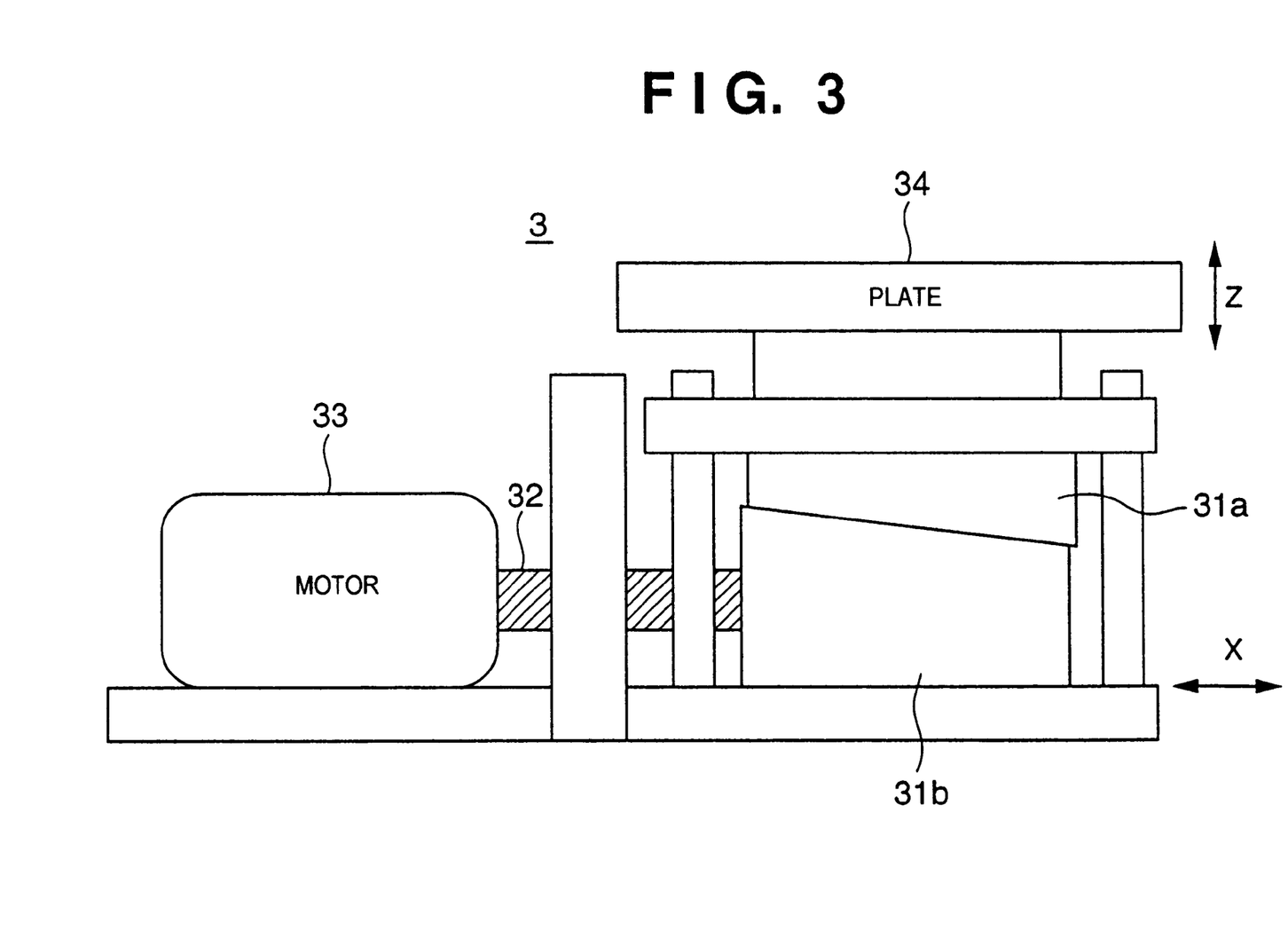
FIG. 3 is a diagram illustrating the structure of a displacement adjustment mechanism provided in the apparatus of FIG. 1.

A device having a wedge-shaped block, a feed screw and an electric motor can be used as the displacement adjustment mechanism 3, the structure of which is illustrated in FIG. 3. The displacement adjustment mechanism 3 includes combined wedge-shaped blocks 31a, 31b, a feed screw 32 and an electric motor 33 for driving the feed screw 32.

The wedge-shaped blocks 31a and 31b can have their relative positions changed along opposing surfaces thereof that are in mutual contact. Structurally, the wedge-shaped block 31b is movable only in the X direction and the wedge-shaped block 31a is movable only in the Z (vertical) direction. The contacting surfaces of the wedge-shaped blocks 31a and 31b are oblique surfaces with regard to the direction in which wedge-shaped block 31b can move and define non-zero angles with respect to both the vertical and horizontal directions. The arrangement is such that the vertical displacement of the wedge-shaped block 31a can be changed by displacing the wedge-shaped block 31b along the X direction. A top plate 34 is rigidly secured to the upper part of the wedge-shaped block 31a, and the lower end of the active oscillation isolating means 2 is rigidly secured to the upper part of the top plate 34.

The electric motor 33 drives the feed screw 32, which is engaged with the wedge-shaped block 31b and causes the wedge-shaped block 31b to be displaced in the x direction. By thus displacing the wedge-shaped block 31b in the X direction using the electric motor 33 and feed screw 32, the wedge-shaped block 31a and top plate 34 can be displaced in the vertical (Z) direction. A speed changing unit such as a gear box may be employed between the electric motor 33 and feed screw 32.

As the result of this structure, the displacement adjustment mechanism 3 functions as a highly rigid displacement adjustment mechanism that adjusts the vertical displacement of the top plate 34 by the operation of the electric motor 33, and therefore the displacement adjustment mechanism 3 has a rigidity sufficiently higher than that of the ordinary oscillation isolation mechanism that relies upon elements such as rubber and springs, etc.

The control unit 10 controls the position and attitude of the oscillation isolation platform using the displacement adjustment mechanism 3. The control unit 10 includes a compensation processing unit 5 for applying appropriate compensation processing to the output signal of the displacement detection means 4, and a driving circuit 6 for driving the electric motor 33 of the displacement adjustment mechanism 3 based upon the output signal of the compensation processing unit 5. The driving circuit 6 is a current amplifier or the like for driving the electric motor 33.

The oscillation isolator according to this embodiment is such that the oscillation isolation platform 1 is supported by the active oscillation isolating means 2 so as to be prevented from oscillating. As a result, isolation and suppression of oscillation transmitted from the pedestal 7 to the oscillation isolation platform 1 and damping of oscillation produced by the driving reaction force of the device mounted on the oscillation isolation platform 1 are all carried out by the active oscillation isolating means 2.

On the other hand, the active oscillation isolating means 2 itself cannot control position and attitude with adequate precision, as described earlier. In addition, there are instances where the rubber laminate 23 undergoes deformation owing to aging. This necessitates a position control operation for maintaining the oscillation isolation platform 1 at a predetermined position and attitude. Accordingly, the position of the oscillation isolation platform 1 is controlled by the displacement adjustment mechanism 3, displacement detection means 4 and control unit 10. This operation will now be described.

<Control of position of oscillation isolation platform 1>

Relative displacement between the oscillation isolation platform 1 and pedestal 7 is detected by the displacement detection means 4 with a satisfactory precision. In the field of precision oscillation isolators, a contactless oscillating-type proximity sensor often is used as a displacement detection means. A signal indicative of the relative displacement between the oscillation isolation platform 1 and pedestal 7 detected by the displacement detection means 4 is input to the compensation processing unit (controller) 5 of the control unit 10. The compensation processing unit 5 calculates the difference between the output signal of the displacement detection means 4 and a signal corresponding to the target position of the oscillation isolation platform 1, adopts this difference as a positioning error signal and subjects this signal to a suitable compensation operation. A control technique such as PID compensation (proportional, integration or differentiation compensation) can be applied as the compensation operation. In this position control operation, it is particularly desirable to apply a compensation operation that includes an integrating compensation element, such as PI compensation (proportional or integrating compensation), in order to situate the oscillation isolation platform 1 at the prescribed target position without error.

The error compensation signal obtained as a result of the compensation operation is input to the driving circuit 6, which proceeds to convert the error compensation signal to current for driving the electric motor 33. As a result, the displacement adjustment mechanism 3 operates in such a manner that the positioning error becomes zero and maintains the oscillation isolation platform 1 at the prescribed position and attitude without error.

The description rendered here deals with the single oscillation isolating mount 50. In actuality, however, it goes without saying that a plurality of oscillation isolating mounts 50, preferably three or more, should be used.

The oscillation isolator according to this embodiment uses a oscillation isolating device based upon a displacement actuator as the active oscillation isolating means 2 for supporting the oscillation isolation platform 1 against oscillation. As a result, oscillation produced by the driving reaction force of the device mounted on the oscillation isolation platform 1 is damped in excellent fashion and transfer of oscillation from the pedestal 7 to the oscillation isolation platform 1 can be kept very small. Further, since the highly rigid displacement adjustment mechanism 3 is provided in series with the active oscillation isolating means 2 dynamically speaking, the oscillation isolation platform 1 can be maintained precisely at the prescribed position and attitude without detracting from the rigidity of the mechanism that supports the oscillation isolator.

In the present invention, a oscillation isolating device using a displacement actuator is used as the active oscillation isolating means 2. As an alternative, however, use can be made of a oscillation-proof support means of another type, such as a oscillation isolating means using oscillation preventing rubber, which itself cannot control position and attitude with sufficient precision. Further, though use is made of an integrated means structure as the oscillation isolating mount 50, an alternative approach that may be used is to provide components, which are equipped with the elements such as the active oscillation isolating means 2, displacement adjustment mechanism 3 and displacement detection means 4, and which are equivalent to the oscillation isolating mount 50 in terms of positional relationship and function, and assemble these components as a combination rather than as a unitary structure. Further, a highly rigid displacement adjustment mechanism other than that of the type described above in this embodiment can be used.

[Second Embodiment]

In the first embodiment, the active oscillation isolating means 2 and the displacement adjustment mechanism 3 both act in the vertical direction. However, an arrangement may be adopted in which these are disposed to act in the horizontal direction to control oscillation and displacement horizontally. Further, it can be so arranged that these are disposed so as to act in both the vertical and horizontal directions to control oscillation and displacement both vertically and horizontally.

Figure 4:
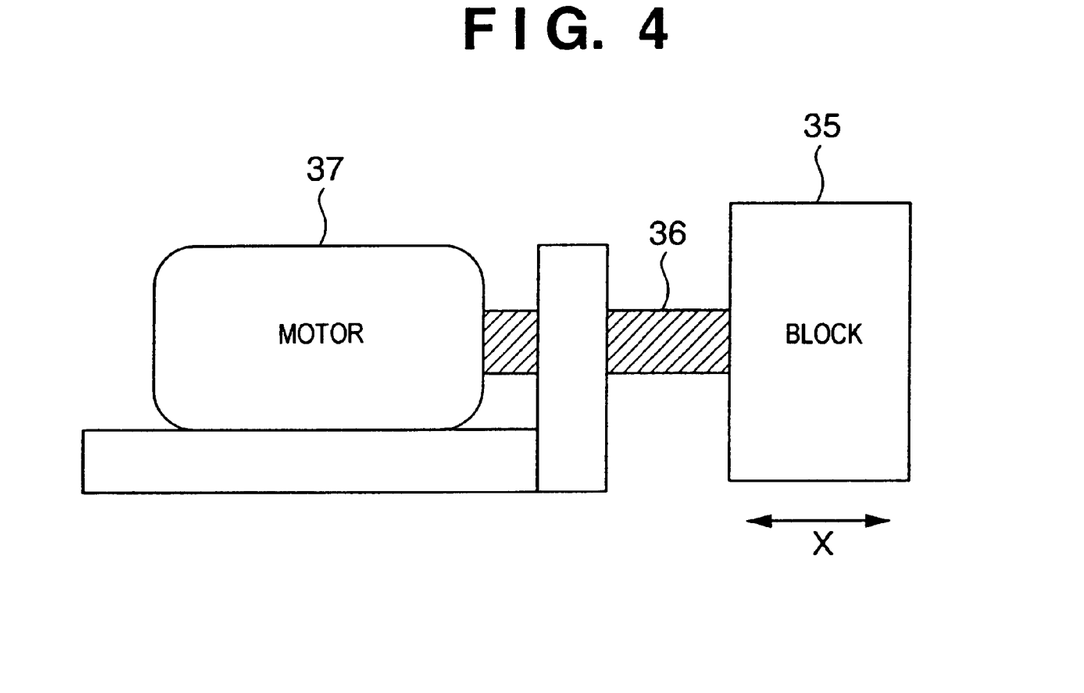
FIG. 4 is a diagram illustrating the structure of a horizontally acting displacement adjustment mechanism provided in an apparatus shown in FIG. 5.
Figure 5:
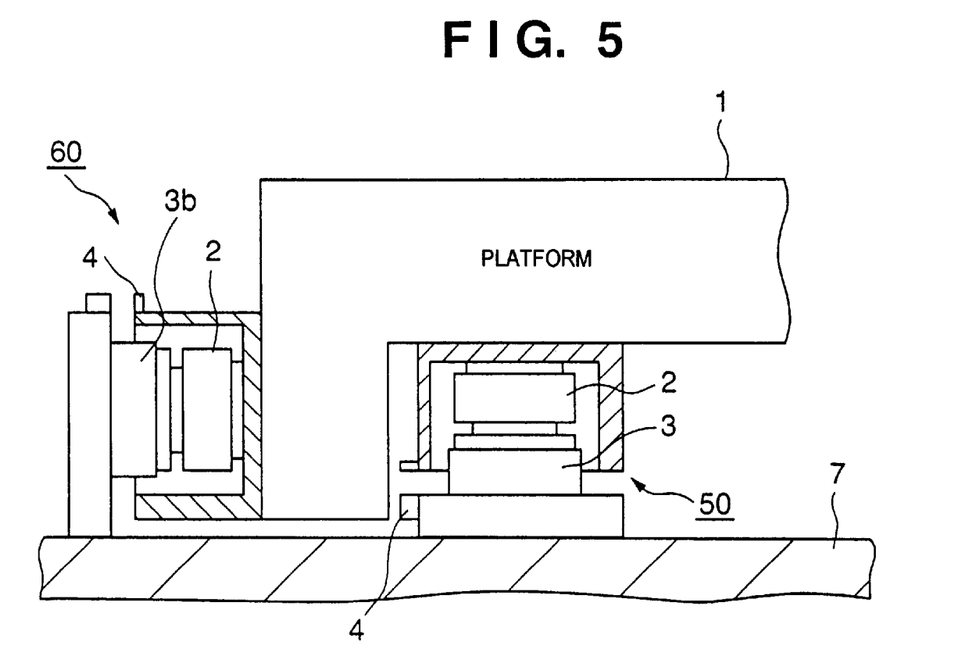
FIG. 5 is a diagram illustrating an oscillation isolator according to a second embodiment of the present invention.

FIG. 5 is a diagram illustrating a oscillation isolator according to a second embodiment of the present invention. Here the oscillation isolator has the oscillation isolating mount 50 and an oscillation isolating mount 60 for supporting the oscillation isolation platform 1 against oscillation in the vertical and horizontal directions, respectively. The oscillation isolating mounts 50 and 60 are both arranged in such a manner that the active oscillation isolating means 2 and displacement adjustment mechanisms 3 and 3b of the respective mounts are disposed serially dynamically speaking. The vertical displacement adjustment mechanism 3 possessed by the oscillation isolating mount 50 may be of the type which uses the wedge-shaped blocks described in the first embodiment, and the horizontal displacement adjustment mechanism 3b possessed by the oscillation isolating mount 60 may be of the type shown in FIG. 4. As shown in FIG. 4, the displacement adjustment mechanism 3b has a feed screw 36, an electric motor 37 for driving the feed screw 36, and a block member 35 engaged with the feed screw 36 and capable of being moved thereby in one direction (the X direction). The displacement adjustment mechanism 3b is such that the feed screw 36 is driven by the electric motor 37, whereby the block member 35 is displaced in the X direction. By rigidly securing the active oscillation isolating means 2 to the block member 35, therefore, the displacement adjustment mechanism 3b can be made to function as a mechanism for adjusting displacement in the horizontal direction. The displacement adjustment mechanism 3b also constitutes a mechanism having a rigidity sufficiently higher than that of the ordinary oscillation isolating mechanism that relies upon rubber members or springs.

The reason for using the mechanism of the type shown in FIG. 4 rather than of the type using the wedge-shaped blocks (described in the first embodiment) as the horizontally acting displacement adjustment mechanism 3b is that unless a pre-pressure is applied in the direction (X direction) along which the displacement adjustment mechanism acts, the arrangement of the type shown in FIG. 3 cannot produce displacement in two directions, namely in case of thrust and retraction. This principle will be described with reference to FIG. 7.

Figure 7:
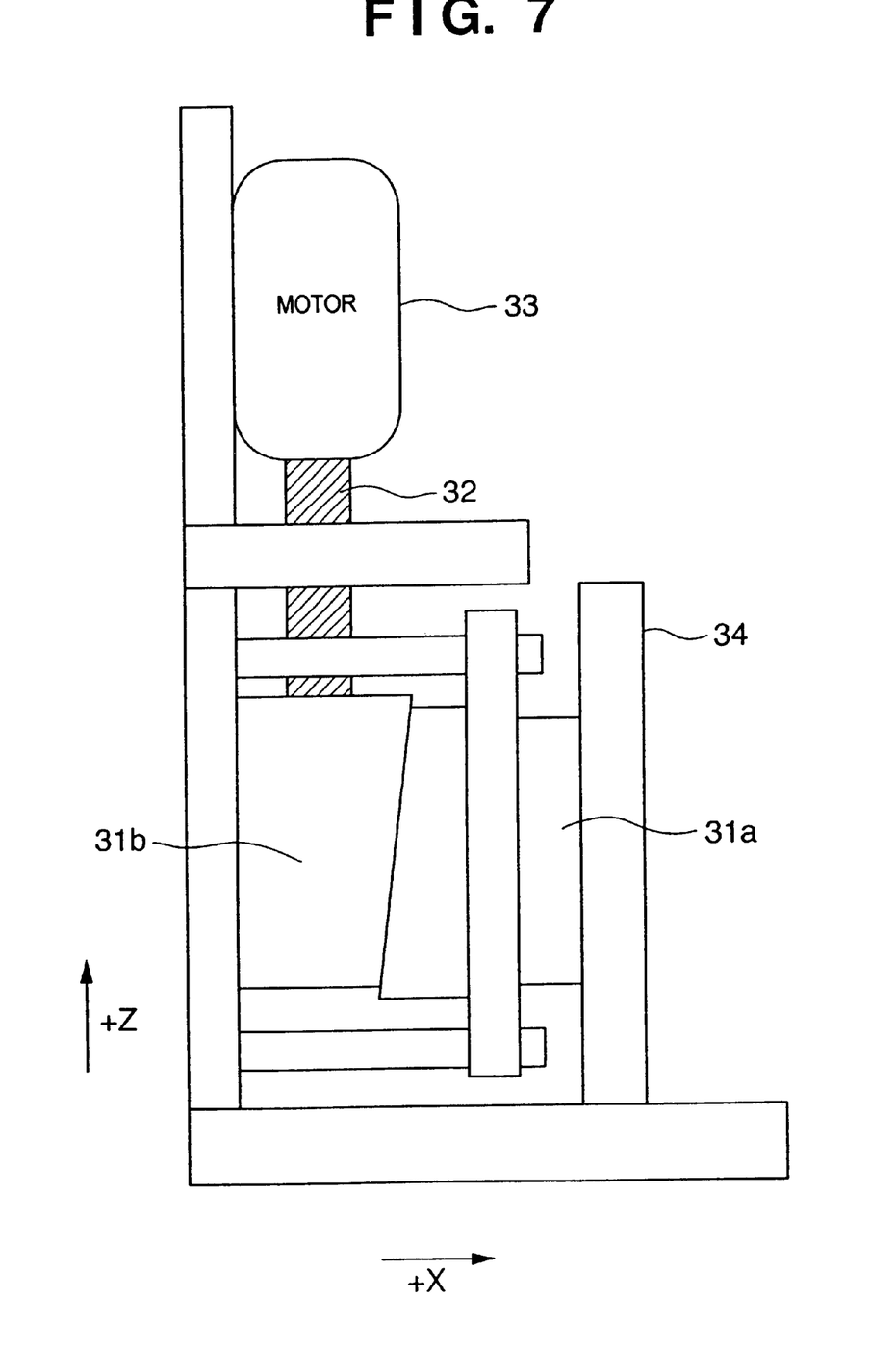
FIG. 7 is a diagram showing an example of an undesirable structure for a horizontally acting phase adjustment mechanism.

FIG. 7 illustrates a mechanism obtained by rotating the phase adjustment mechanism of FIG. 3 90° about the horizontal axis so that the mechanism will act in the horizontal direction. Basically, this mechanism is composed of components having functions similar to those of FIG. 3 and these components are designated by like reference characters.

The mechanism shown in FIG. 7 is such that if the wedge-shaped block 31a is to be displaced in the +X direction illustrated, then it will suffice to drive the electric motor 33 to displace the wedge-shaped block 31b in the illustrated −Z direction (downward in FIG. 7). However, displacing the wedge-shaped block 31b to drive the wedge-shaped block 31a in the −X direction (leftward) is impossible as long as there no pre-pressure mechanism to push the wedge-shaped block 31a in the −X direction. Displacing the wedge-shaped block 31b in the +Z direction in the absence of a pre-pressure mechanism would cause the wedge-shaped blocks 31a and 31b to separate from each other. With the displacement adjustment mechanism that acts in the vertical direction in FIG. 3, the necessary pre-pressure is applied by the weight of the oscillation isolation platform 1 itself. In the case of FIG. 7, on the other hand, there is no pre-pressure in the horizontal direction as long as such pressure is not applied by some means. Accordingly, a mechanism of the type shown in FIG. 4, which does not require such pre-pressure, is desirable as the horizontally acting displacement adjustment mechanism.

Thus, the oscillation isolator of this embodiment uses the displacement adjustment mechanisms 3 and 3b of different types for acting in the vertical and horizontal directions in order to control displacement vertically and horizontally. The active oscillation isolating means 2 provided in the oscillation isolating mount 50 to control oscillation in the vertical direction is the same as that shown in FIG. 2. The active oscillation isolating means 2 provided in the oscillation isolating mount 60 to control oscillation in the horizontal direction is obtained by rotating the unit of FIG. 2 90° about the horizontal axis in such a manner that operating axis of this unit is rendered horizontal. Accordingly, the active oscillation isolating means 2 and the displacement adjustment mechanism 3b of the oscillation isolating mount 60 are disposed so as to act in the same direction.

In a manner similar to that of the first embodiment, control of displacement in the oscillation isolating mounts 50 and 60 is performed by driving the displacement adjustment mechanisms 3 and 3b by signals obtained by subjecting output signals from the vertical and horizontal displacement detection means 4 to compensation processing by a control unit not shown in FIG. 5. Control of the active oscillation isolating means 2 in the oscillation isolating mounts 50 and 60 also can be carried out in a manner similar to that of the first embodiment.

In accordance with this embodiment, the oscillation isolating mounts 50 and 60 having the displacement adjustment mechanisms are disposed in the vertical and horizontal directions. As a result, it is possible to control, with a very high precision, the vertical and horizontal oscillation and displacement of the oscillation isolation platform 1 and the device placed thereon to be isolated from oscillation.

In this embodiment, the displacement adjustment mechanism is of the type which displaces a block member using a feed screw. However, a high-rigidity displacement adjustment mechanism of another type may be used instead.

[Third Embodiment]

In a case where the apparatus of both the first and second embodiments is applied, the attitude of the oscillation isolation platform 1 and the force that acts upon the oscillation isolation platform 1 can both be uniquely decided if the oscillation isolation platform 1 is supported at three points in each of the vertical and horizontal directions. However, in a case where the oscillation isolation platform 1 is supported by four or more support legs, for example, it is obvious that redundancy results in comparison with a case where the attitude of the oscillation isolation platform 1 in relation to the vertical direction is governed by three-degrees-of-freedom, namely translation along the vertical axis and rotation about two horizontal axes.

This means that when the same attitude is realized, the balance of forces which the support legs apply to the oscillation isolation platform 1 is not uniquely decided. In extreme cases it is possible that one of the four support legs will apply absolutely no force to the oscillation isolation platform 1 while the other three support legs can maintain the attitude of the oscillation isolation platform 1. However, this results in the oscillation isolation platform 1 being subjected to forces that are not in proper balance. There is the danger that this will cause deformation of the oscillation isolation platform 1 and have an adverse effect upon the performance of the precision device mounted on the oscillation isolation platform 1.

This embodiment will be described in regard to an example in which the oscillation isolator of the invention is controlled properly taking these points into consideration.

Figure 6:
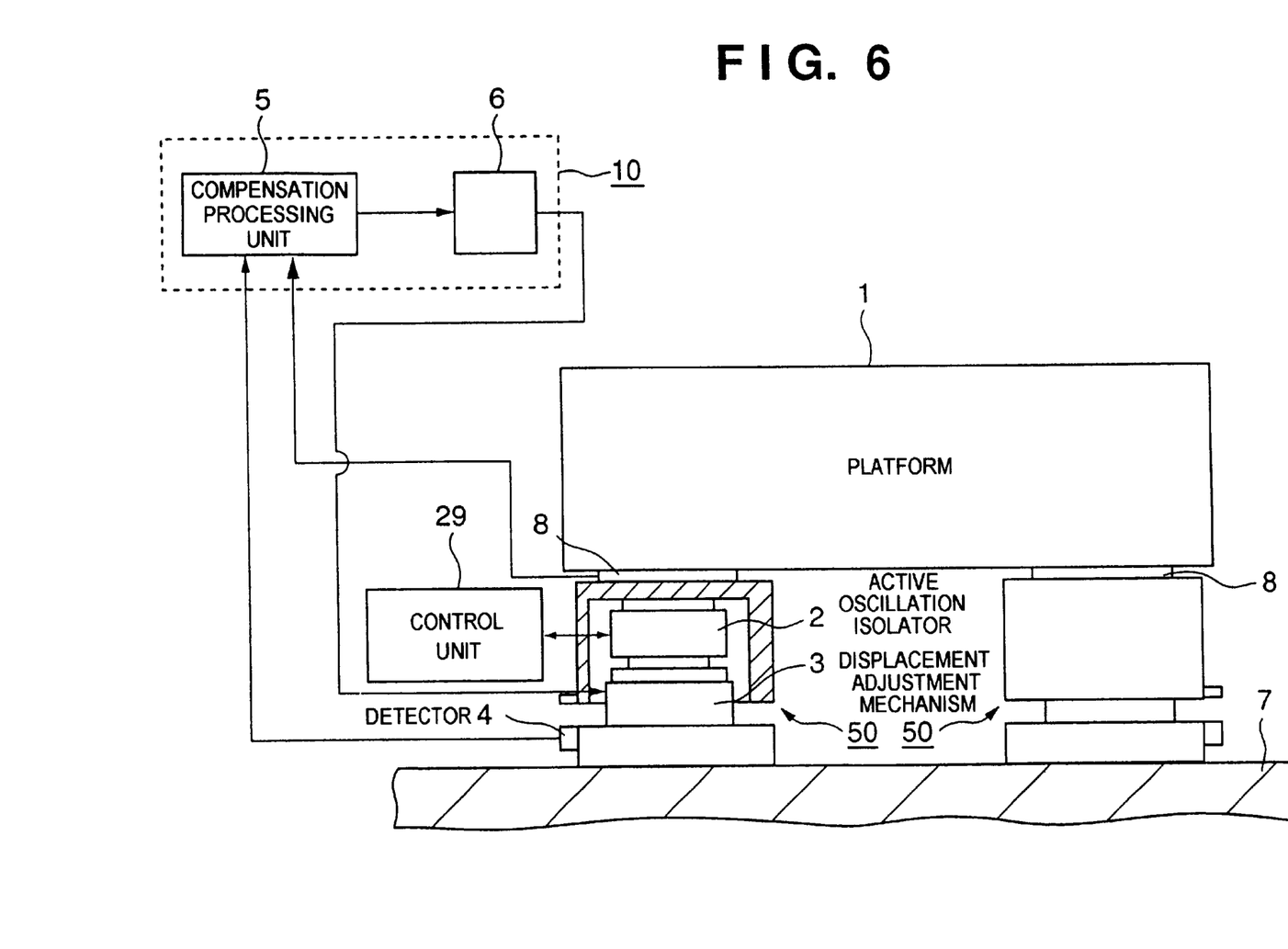
FIG. 6 is a diagram illustrating an oscillation isolator according to a third embodiment of the present invention.

The oscillation isolator shown in FIG. 6 is obtained by providing the vertically acting oscillation isolator of FIG. 1 with a force sensor 8 provided between the oscillation isolation platform 1 and the oscillation isolating mount 50 to sense the force acting between the two. The displacement adjustment mechanism 3 is controlled using the output signal of the force sensor 8 in addition to the signals mentioned earlier. In other respects the structures of the active oscillation isolating means 2 and displacement adjustment mechanism 3, etc., are similar to those shown in FIG. 1.

In this arrangement, the output signal of the force sensor 8 indicative of the force acting between the oscillation isolation platform 1 and oscillation isolating mount 50 enters the compensation processing unit (controller) 5 of the control unit 10. In addition to the displacement-signal compensation operation already described in the first embodiment, the compensation processing unit 5 executes a compensation operation also with regard to the output signal of the force sensor 8. This compensation operation is carried out so as to apply suitable compensation in such a manner that the force acting between the oscillation isolation platform 1 and oscillation isolating mount 50 will not depart from a predetermined fixed range. Here it is preferred to adopt an arrangement in which the compensation processing unit 5 calculates a difference signal between a predetermined force target value and the output signal of the force sensor 8, adds (a) a signal obtained by applying a suitable compensation operation to this difference signal and (b) a signal obtained by applying a compensation operation to the output signal of the displacement detection means 4, and sends the resultant signal to the driving circuit 6.

By thus controlling the amount of displacement of the displacement adjustment mechanism 3, the force acting between the oscillation isolation platform 1 and oscillation isolating mount 50 can be controlled appropriately in addition to the displacement and attitude of the oscillation isolation platform 1. This makes it possible to reduce or eliminate various adverse effects upon the performance of the device mounted on the oscillation isolation platform 1, which effects can arise when the oscillation isolation platform 1 is subjected to improperly balanced forces by a plurality of oscillation isolators.

This embodiment has been described in regard to a oscillation isolator that acts in the vertical direction. However, control using a force sensor can be performed in the same manner even in the case of a horizontally acting oscillation isolator.

Thus, in accordance with the present invention as described above, even if a oscillation isolator does not possess a satisfactory position and attitude control function, as when a oscillation-proof support means employs a displacement actuator, the position and attitude of a supported oscillation isolation platform can be maintained stably and with good reproducibility without sacrificing the merits of oscillation isolation capability and high rigidity possessed by the oscillation-proof support means.

In particular, in a case where the oscillation-proof support means is one that uses a displacement actuator, oscillation produced by the driving reaction force of the device mounted on the oscillation isolation platform is damped in excellent fashion and transfer of oscillation from the pedestal to the oscillation isolation platform can be kept very small. At the same time, the oscillation isolation platform can be maintained precisely at the prescribed position and attitude, without a decline in the rigidity of the support mechanism of the oscillation isolator, by the highly rigid displacement adjustment mechanism arranged dynamically in series with the active oscillation-proof support means.

Furthermore, by controlling the displacement adjustment mechanism using the output signal of a force sensor which senses the force acting between the oscillation isolation platform and the oscillation isolator, this force can be controlled appropriately in addition to the displacement and attitude of the oscillation isolation platform. This makes it possible to reduce or eliminate various adverse effects upon the performance of the device mounted on the oscillation isolation platform 1. These effects can arise when the oscillation isolation platform 1 is subjected to improperly balanced forces.

As many apparently widely different embodiments of the present invention can be made without departing from the spirit and scope thereof, it is to be understood that the invention is not limited to the specific embodiments thereof except as defined in the appended claims.

What is claimed is:

1. An oscillation isolator for supporting an oscillation isolation platform on a pedestal, said oscillation isolator having:

active oscillation isolation means having a displacement generating type actuator to reduce oscillation of the oscillation isolation platform;

displacement adjustment means provided between said active oscillation isolation means and the oscillation isolation platform or the pedestal for adjusting relative displacement between said active oscillation isolation means and the oscillation isolation platform or the pedestal, said displacement adjustment means having a rigidity higher than that of said active oscillation isolation means, and being dynamically locating in series between said active oscillation isolation means and the oscillation isolation platform or the pedestal.

2. The oscillation isolator according to claim 1, further comprising:

detecting means for detecting relative displacement between the oscillation isolation platform and the pedestal, wherein said displacement adjustment means is controlled based on a detected signal of said detecting means in order to adjust a position or attitude of the platform.

3. The oscillation isolator according to claim 1, wherein said active oscillation isolation means includes:

an elastic member for isolating oscillation with respect to said active oscillation isolation platform;

an intermediate member for connecting said displacement generating type actuator and said elastic member;

a first oscillation sensor for sensing oscillation of the oscillation isolation platform;

a second oscillation sensor for sensing oscillation of said intermediate member, wherein said displacement generating type actuator is controlled based on the detected signals of said first and second sensors in order to reduce oscillation of the oscillation isolation platform.

4. The oscillation isolator according to claim 3, further comprising:

a third oscillation sensor for sensing oscillation of the pedestal;

wherein the detected signal of said third oscillation sensor is used for control of said displacement generating type actuator to reduce transfer of oscillation from the pedestal to the oscillation isolation platform.

5. The oscillation isolator according to claim 1, wherein said displacement actuator is either a piezoelectric actuator, a magnetostrictive actuator or an ultramagnetostrictive actuator.

6. An oscillation isolator for supporting an oscillation isolation platform on a pedestal, said oscillation isolator comprising:

oscillation isolation means for reducing oscillation of the oscillation isolation platform; and displacement adjustment means provided between said oscillation isolation means and the oscillation isolation platform or the pedestal for adjusting relative displacement between said oscillation isolation means and the oscillation isolation platform or the pedestal, said displacement adjustment means having a rigidity higher than that of said oscillation isolation means, wherein said displacement adjustment means includes:

first and second wedge-shaped members;

a screw mechanism for feeding said first wedge-shaped member in a first direction; and said second wedge-shaped member being fed in a second direction by feeding via said first wedge-shaped member being fed by said screw mechanism, whereby relative displacement between said active oscillation isolation means and the oscillation isolation platform or the pedestal is adjusted.

7. An oscillation isolator for supporting an oscillation isolation platform on a pedestal, said oscillation isolator comprising:

oscillation isolation means for reducing oscillation of the oscillation isolation platform; and displacement adjustment means provided between said oscillation isolation means and the oscillation isolation platform or the pedestal for adjusting relative displacement between said oscillation isolation means and the oscillation isolation platform or the pedestal, said displacement adjustment means having a rigidity higher than that of said oscillation isolation means, wherein said displacement adjusting means includes:

a screw mechanism for feeding a feed member;

said feed member being fed by said screw mechanism, whereby relative displacement between said oscillation isolation means and the oscillation isolation platform or the pedestal is adjusted.

8. An oscillation isolator for supporting an oscillation isolation platform on a pedestal, said oscillation isolator comprising:

oscillation isolation means for reducing oscillation of the oscillation isolation platform;

displacement adjustment means provided between said oscillation isolation means and the oscillation isolation platform or the pedestal for adjusting relative displacement between said oscillation isolation means and the oscillation isolation platform or the pedestal, said displacement adjustment means having a rigidity higher than that of said oscillation isolation means, said displacement adjustment means comprising:

a force sensor for sensing a force between said oscillation isolator and the oscillation isolation platform, wherein said displacement adjustment means is controlled on the basis of an output signal from said force sensor, such that the force that acts between said oscillation isolator and the oscillation isolation platform is between a predetermined range.

9. The oscillation isolator according to claim 6, wherein the relative displacement is in a vertical direction.

10. The oscillation isolator according to claim 7, wherein the relative displacement is in a horizontal direction.

* * * * *

UNITED STATES PATENT AND TRADEMARK OFFICE
CERTIFICATE OF CORRECTION

PATENT NO. : 6,518,721 B2
DATED : February 11, 2003
INVENTOR(S) : Takehiko Mayama It is certified that error appears in the above-identified patent and that said Letters Patent is hereby corrected as shown below:

Column 7,
Line 52, "x" should read -- X --.

Signed and Sealed this

Seventh Day of October, 2003

JAMES E. ROGAN
*Director of the United States Patent and Trademark Office*